(12) United States Patent
Rakheja et al.

(10) Patent No.: US 8,464,117 B2
(45) Date of Patent: Jun. 11, 2013

(54) SYSTEM FOR TESTING INTEGRATED CIRCUIT WITH ASYNCHRONOUS CLOCK DOMAINS

(75) Inventors: Shruti Rakheja, Bangalore (IN); Sunny Arora, Noida (IN); Pawan Deep Gandhi, Faridabad (IN); Rashmi Moudgil, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 516 days.

(21) Appl. No.: 12/786,467

(22) Filed: May 25, 2010

(65) Prior Publication Data

US 2011/0296265 A1    Dec. 1, 2011

(51) Int. Cl.
*G01R 31/28* (2006.01)
(52) U.S. Cl.
USPC .......................................... 714/731
(58) Field of Classification Search
USPC ............... 714/731, 726, 724, 699, 700, 707, 714/798; 713/400, 500, 503, 600
See application file for complete search history.

(56) References Cited

U.S. PATENT DOCUMENTS

| | | | |
|---|---|---|---|
| 5,663,966 A | 9/1997 | Day | |
| 6,070,260 A | 5/2000 | Buch | |
| 6,115,827 A | 9/2000 | Nadeau | |
| 7,206,983 B2 * | 4/2007 | Alyamani et al. | 714/729 |
| 7,210,082 B1 | 4/2007 | Abdel-Hafez | |
| 7,248,143 B2 * | 7/2007 | Emmerling et al. | 340/5.62 |
| 7,555,688 B2 * | 6/2009 | Alvamani et al. | 714/729 |
| 7,698,613 B2 * | 4/2010 | Kudo | 714/731 |
| 7,788,558 B2 * | 8/2010 | Shimooka | 714/726 |
| 7,827,509 B2 * | 11/2010 | Chmelar | 716/52 |
| 7,872,490 B2 * | 1/2011 | Fukunaga et al. | 326/16 |
| 7,917,823 B2 * | 3/2011 | Dehnert et al. | 714/731 |
| 8,028,209 B2 * | 9/2011 | Li et al. | 714/731 |
| 8,055,965 B2 * | 11/2011 | Kaneko | 714/729 |
| 2011/0276849 A1 * | 11/2011 | Periasamy et al. | 714/731 |

* cited by examiner

*Primary Examiner* — Phung M Chung
(74) *Attorney, Agent, or Firm* — Charles Bergere

(57) ABSTRACT

A system for scan testing various clock domains of an integrated circuit includes a clock gate control unit and clock gating cells. The clock gating cells receive a single test clock signal provided externally through one package pin of the integrated circuit. The clock gate control unit provides clock gate control signals to the clock gating cells. The clock gating cells generate time-staggered clock signals based on the clock gate control signals.

8 Claims, 7 Drawing Sheets

SYSTEM FOR TESTING INTEGRATED CIRCUIT WITH ASYNCHRONOUS CLOCK DOMAINS

BACKGROUND OF THE INVENTION

The present invention relates to a testing system for integrated circuits (ICs) and more particularly, generating clock signals for scan testing of asynchronous domains of integrated circuits.

Integrated circuits (ICs) include multiple clock domains. These clock domains include several storage elements that may vary in type and size. Each clock domain is driven by a clock signal. The clock signals provided to the various clock domains are derived from signals generated using one or more clock sources. The clock sources include components such as an external crystal oscillator, internal resistor capacitor (RC) oscillators and phase locked loops. The clock signals generated by the various clock sources may be asynchronous with respect to each other. The clock signal provided to a clock domain further is branched out through a series of buffers to form a plurality of clock signals. The structure of the branching of the clock signal is called a clock tree. For reasons such as differing clock tree builds and routing delays, any two clock signals may be offset with respect to one another. This finite difference in clock signals is called clock skew. When the storage elements clocked using the skewed clock signals communicate with each other, timing violations such as setup and hold violations may occur. To avoid setup and hold violations, the clock signal is distributed through a skew minimized network within a clock domain. Thus, the clock skew within a clock domain is minimized; however, inter-domain clock skew may still exist. The inter-domain clock skew may not interfere in the functional operation of a pair of asynchronous domains because the stability of inter-action between such domains is provided by the IC design through the use of appropriate synchronizers, for example.

It is well-known that ICs are prone to various types of manufacturing defects. Structural testing paradigms, such as Design for Test (DFT), have been created to detect the occurrence of such faults. Scan-based tests form a major part of IC post-production testing. Scan-based testing may be divided into stuck-at testing and at-speed testing. Stuck-at testing detects static faults and at-speed testing detects delay faults like transition faults and path delay faults. Subsequent description is focused on stuck-at fault testing of ICs. To enable scan testing in a design, the clock signal provided to the storage elements must be controlled from an external primary input of the IC. However, due to test cost implications, mapping each functional clock domain to an independent top-level clock pin is not feasible. Hence, chip designers target using a minimum number of pins to test a device. Therefore, even though there may be multiple asynchronous functional clock domains, they are mapped to a single external pin during stuck-at testing. Performing timing closures for such architecture is challenging.

As is known in the art, a scan test includes a shift phase and a capture phase. During the shift phase, the various storage elements are configured into scan chains, and a test data sequence (test stimulus) is shifted into the scan chains through scan inputs. At the end of the shift phase, the loaded stimuli are applied to a combinatorial circuit. Subsequently, during the capture phase, functional responses of the combinational circuit to the applied test stimuli are captured in the storage elements and then shifted-out.

The test patterns used for scan testing are generated using an Automated Test Pattern Generator (ATPG) tool. These test patterns are based on assumption of an ideal clock, which means that the clock signal reaches each clock domain simultaneously without skew. However, as discussed above the clock skew between various clock domains may lead to large differences between the various clock signals used to drive the clock domains. During a scan capture operation, that may involve inter-domain communication, the clock skew may lead to data transitions associated with a first clock domain to fall in the setup or hold time window of a second clock domain, thereby causing erroneous operation. Since, scan vectors (used as test stimuli) are generated based on the zero clock skew assumption, application of the scan vectors to the design is prone to timing errors. Therefore, concurrent pulsing of all the internal scan clock domains during the capture cycle is not feasible. However, if each of the various clock domains are controlled by separate external scan clocks, concurrent pulsing of the unbalanced clock domains can be avoided by externally offsetting clock signals. This provides the first clock domain suitable time to settle before a second clock domain receives the active clock edge. Since, during stuck-at testing, the frequency of capture is not high and specifically static faults are targeted, the clock pulses may be spaced apart without impacting scan test performance. However, increasing the number of clock pins leads to a direct increase in tester resources, which in turn impacts the test cost of the device.

An alternative to the above procedure may be to enable concurrent pulsing of several internal scan clock domains by design. This implies that timing violations between such internal scan clock domains are eliminated in the physical design. This process is iterative, time consuming, and thus impacts design and design-cycle time.

Referring now to FIG. 1A, a system 100 is shown. The system 100 includes an IC 104. The IC 104 includes clock domains 106a, 106b, and 106c. The clock domain 106a includes scan chains 108a and 108b. Similarly, the clock domain 106b includes scan chains 108c and 108d and the clock domain 106c includes scan chains 108e and 108f. FIG. 1B is a timing diagram 110 illustrating an exemplary operation during scan testing of the IC 104. The timing diagram 110 includes waveforms 112a, 112b, and 112c, and a set-up and hold time window 114.

When ATPG test patterns are provided to the IC 104, the test vectors are provided to the clock domains 106a, 106b, and 106c. Thereafter, responses to the test vectors are received. The responses are output from the IC 104 and compared with expected test vector responses on an external tester (not shown) to determine whether there are any faults. Such typical scan testing progresses through the following steps: shift-in, capture, and shift-out, all of which are controlled by the test clock signal, TEST CLK. TEST CLK is provided externally through a pin of the IC 104 and distributed to the clock domains 106a, 106b, and 106c as internal clock signals CLK A, CLK B, and CLK C. During the shift-in phase of the scan test, the scan chains 108a, 108b, 108c, 108d, 108e, and 108f are loaded with test patterns at active edges of CLK A, CLK B, and CLK C. Depending on the number of scan cells in the scan chains 108a, 108b, 108c, 108d, 108e, and 108f, a certain number of TEST CLK pulses are provided for loading the scan chains with test patterns. At the last TEST CLK pulse of the shift-in phase, the test patterns are applied to the combinatorial logic circuit. Subsequently, the capture phase of the scan test is initiated. At the capture pulse, the functional responses of the combinational logic circuits are captured. Thereafter, the shift-out phase is initiated, which involves shifting the test response out of the scan cells to the scan out pins of IC 104, and to the external tester (not shown). The external tester compares the test response data with the expected "good-device" response data to differentiate between an error-free device and a faulty device.

It should be realized that for testing communication links between the first clock domain, such as the clock domain 106a and the second clock domain, such as the clock domain 106b, inter-domain communication is required. Inter-domain communication involves launching of test data from the clock domain 106a to the clock domain 106b and the receipt of the test data by the clock domain 106b to determine whether the communication channel between the clock domains 106a and 106b is damaged. The test patterns used to perform the above-mentioned test are based on the no-skew assumption between the clock signals received by the clock domains 106a and 106b. However, due to clock skew, the testing may not progress in the above described manner. A transition, shown in the waveform 112b in FIG. 1B, at the output of the clock domain 106a, may occur such that the transition falls within the set-up and hold time window 114 of the clock domain 106b. This timing error leads to erroneous data capture by the clock domain 106b, thereby hampering inter-domain testing. To avoid capture of erroneous data, timing errors needs to be eliminated. In the present state of the art, the timing errors are eliminated by including a large number of hold buffers in the IC 104. This process is iterative and cumbersome. Additionally, the large number of hold buffers increases chip area and causes the IC 104 to consume more power.

As technology nodes shrink, the variation in signal path delays becomes non-linear across different process, voltage and temperature (PVT) corners. Further, different sets of signal paths may become critical depending on the different PVT corners. The number of PVT corners also increases at such lower nodes, which makes this exercise all the more tedious. Additionally, taking into account on-chip variations (OCV) and noise further add to the effort of performing timing closure. Thus, meeting timing requirements is requiring an increasing number of iterations, thereby increasing design cycle time and new product introduction (NPI) cycle time.

Problems encountered in the system 100 depicted in FIG. 1A are resolved by either controlling external clock inputs by providing tester offsets (in case of multiple external scan clocks), or by adding delay elements in the clock signal paths. FIG. 1C illustrates an IC 120 including the clock domains 106a, 106b and 106c and the scan chains 108a-108f, as well as delay elements 122a, 122b, and 122c. The delay elements 122a, 122b, and 122c were inserted in the clock paths leading to the clock domains 106a, 106b, and 106c. The delay elements 122a-122c are configured to introduce different delays in the corresponding clock paths in order to overcome inter-domain clock skews.

FIG. 1D is a timing diagram 124 illustrating the operation of the IC 120. The timing diagram includes the waveforms 112a-112c shown in FIG. 1B as well as a waveform of adjusted CLK B 112d and a setup and hold window 116. The insertion of the delay elements 122a-122c in the clock paths increases the skew between active edges of two clock domains. The skew is deliberately increased such that a first set of flip-flops is provided with an appropriate amount of time to settle before a second set of flip-flops is pulsed. As may be observed from FIG. 1D, the transition in the waveform 112b does not fall in the setup and hold window 116 of the adjusted CLK B waveform 112d.

The above-suggested solution eliminates the need for balancing the internal scan clocks. However, internal delay elements are capable of offsetting the clock signals only in a particular direction. Additionally, using the above approach and using a single external clock pin, various sequences of clock pulsing during capture cannot be created. For example, if CLK B is delayed more than CLK A by the delay elements, there will not be a clock sequence that pulses CLK B preceding the pulse on CLK A. Further, the above-described skew compensation technique causes the scan output data generated to be different from that predicted by the ATPG tool, as the ATPG tool is not timing aware. Therefore, the scan vectors need post-processing. It would be advantageous to be able to close timing violations and be able to determine stuck-at faults without overly impacting design time, IC real estate, and IC power consumption.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1A:
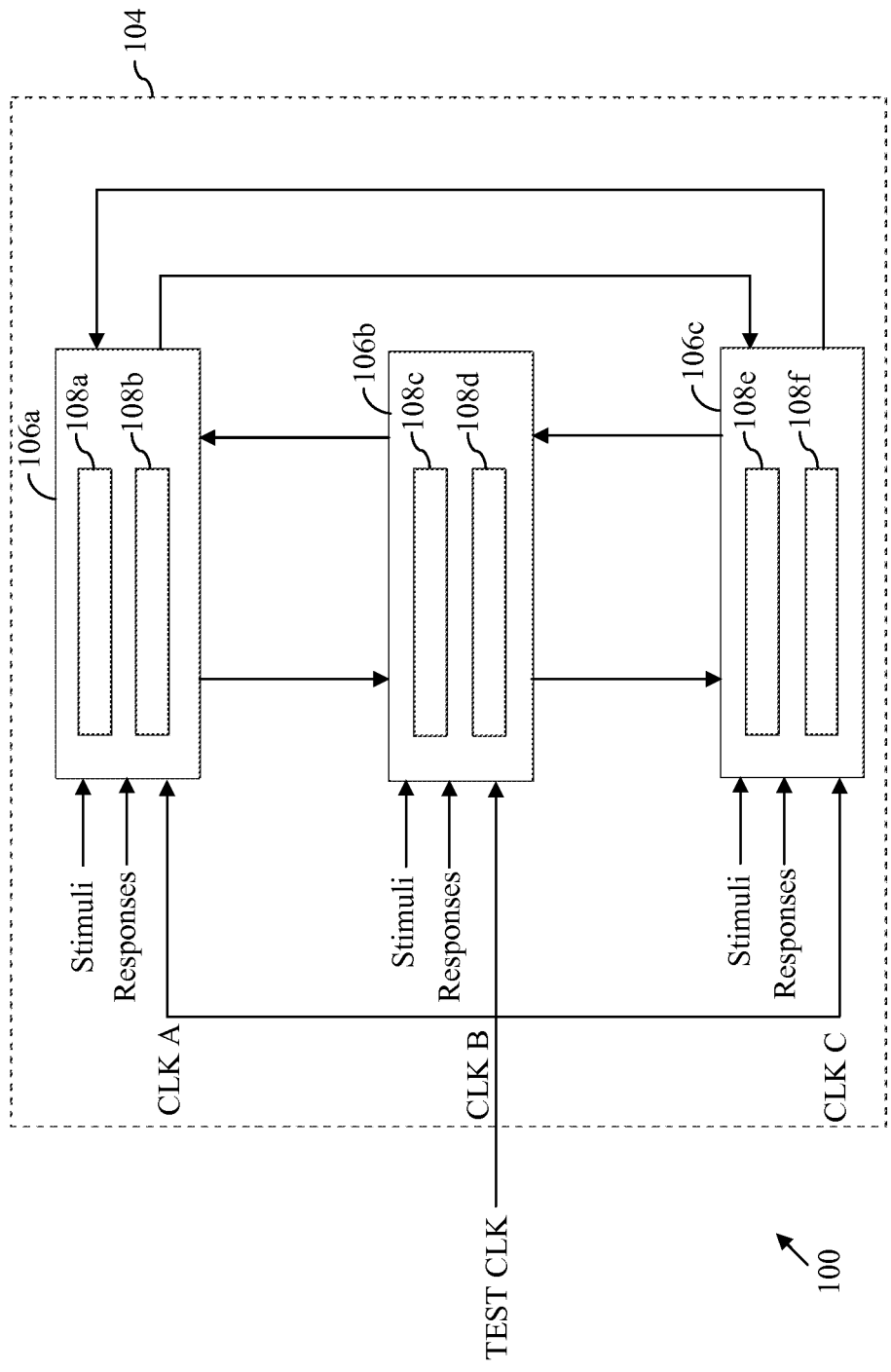
FIG. 1A is a schematic block diagram of a conventional system that can be tested via scan testing.
Figure 1B:
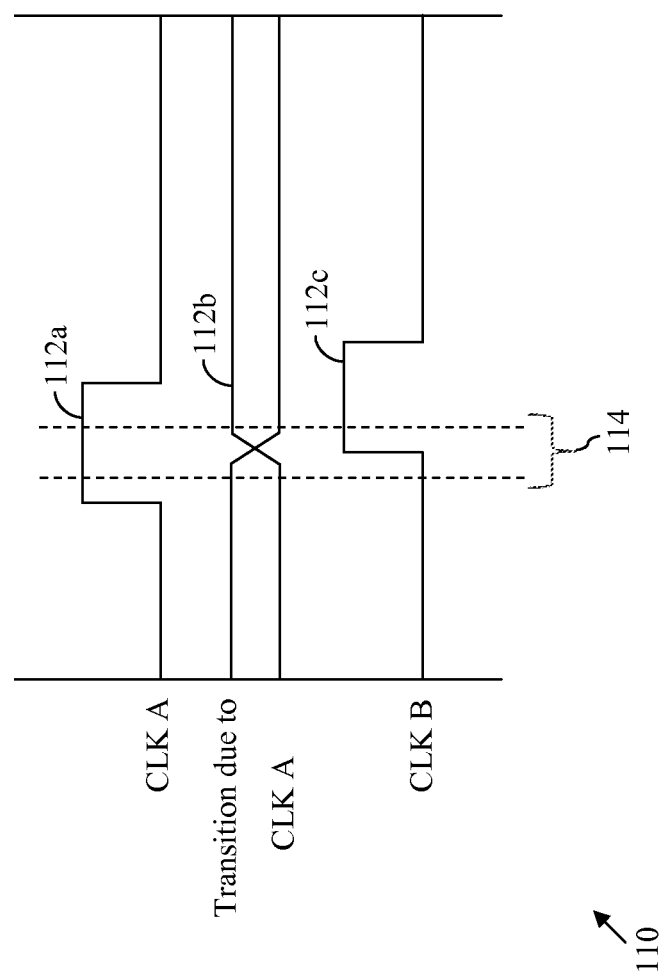
FIG. 1B is a timing diagram illustrating the operation of the system of FIG. 1A.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The present invention provides a system and method to facilitate the scan testing of multiple asynchronous but interacting clock domains. The system uses a single clock pin and generates multiple scan clocks in a manner that introduces time staggering between the scan clocks, which eliminates the need of balancing the internal scan clock-paths. The system is flexible in that it provides any desired sequence of pulses on all the clock domains during a scan capture phase and provides the same level of controllability as would have been available if these clocks were independently controllable from external pins.

In an embodiment of the present invention, a system for generating a plurality of time-staggered clock signals for scan testing an integrated circuit includes sets of registers clocked by a single test clock signal, wherein the one or more registers are loaded with one or more codewords. A decoder is connected to the one or more registers. The decoder provides clock gate control signals based on the data bits provided by the registers. A plurality of clock gating cells is connected to the decoder. The clock gating cells provide the plurality of time-staggered clock signals based on the clock gate control signal and the test clock signal.

In another embodiment of the present invention, a system for scan testing an integrated circuit that has multiple clock domains is provided. The clock domains are driven by a plurality of time-staggered clock signals that are generated using a single test clock signal. The test clock signal is provided through a single external test clock pin of the integrated circuit. The system includes registers loaded with codewords, where the registers are clocked by the test clock signal. A decoder is connected to the registers. The decoder provides clock gate control signals based on the data bits provided by the registers. A plurality of clock gating cells is connected to the decoder. The clock gating cells provide the time-staggered clock signals based on the clock gate control signal and the test clock signal.

Various embodiments of the present invention provide a system for generating time-staggered clock signals for scan testing clock domains of an integrated circuit. The system includes a clock gate control unit and clock gating cells. It should be appreciated by persons skilled in the art that the existing functional clock gating cells present in the IC may be used to meet the above requirement of clock gating cells. The clock gating cells are connected to the clock gate control unit and the clock domains and receive a single test clock signal. The clock gate control unit includes sets of functional shift registers and a decoder. The decoder generates clock gate control signals based on the codewords with which the registers are initialized during the scan test shift-in operation. The clock gating cells enable (or disable) the propagation of the test clock signal to the clock domains based on the clock gate control signals. Thus, the internal clock signals to the various clock domains are generated using the single test clock signal provided through one external clock pin. The generation of multiple internal clock signals using one external clock signal provided through one external clock pin saves on tester resources.

The provision of loading the registers with an appropriate codeword for generating a desired pattern of internal clock signals enables time-staggering of the active edges of the various internal clock signals. The time-staggered clock signals eliminate the possibility of hold timing violations. Using the system of the present invention, the probability of concurrent pulsing of two clock domains is eliminated. The data from a first clock domain has appropriate time to settle before a second clock domain is pulsed. The time required for settling of data from the first clock domain is determined by the frequency of the external test clock. Thus, the necessity for performing timing closures for meeting hold time requirements is eliminated, thereby saving design cycle time. Further, the elimination of possibility of hold time violations ensures reliability of scan testing results and improved detection of inter-domain faults in the integrated circuit.

Additionally, in accordance with the system of the present invention, the pulsing of all clock domains in a staggered manner during the scan test capture phase is provided. In one embodiment of the invention, the system includes shift registers that allow any desired number of pulses in the capture phase of scan test. This in turn enables usage of test patterns with any desired sequential depth. The combination of both helps in reducing the overall pattern count and reduction in test time. With the system of the present invention, a single capture operation can target a larger number of faults within the clock domain as well as faults of the inter-clock domain. Hence, the total number of scan patterns required to completely test the IC is reduced considerably, as compared to the number of test patters required using the conventional approach in which the pulsing is restricted to a single domain in one pattern.

Further, the various clock domains may be clocked in any desired order during capture. The flexibility of clocking the domains in any desired order ensures pattern compaction. Restricting the sequencing to a fixed manner reduces test coverage of one capture operation to a smaller set of the inter-domain combinational logic (as compared to the test coverage without the restriction), which leads to an increase in the total number of scan patterns necessary to completely cover the IC. Additionally, the uncomplicated nature of the present invention enables easy association with various known in the art ATPG tools. Further, there is no need to perform any post-processing of the output ATPG patterns.

Figure 1C:
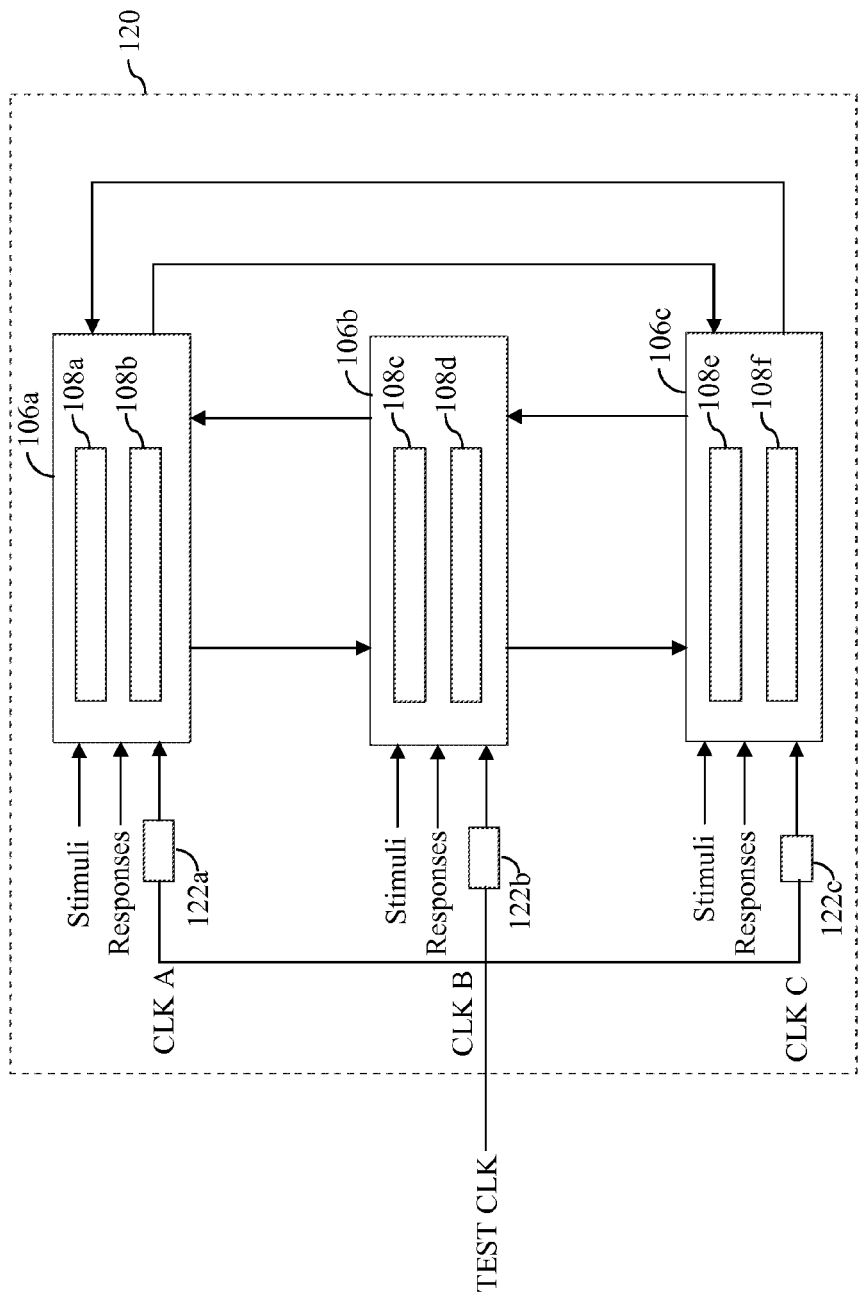
FIG. 1C is a schematic block diagram of another conventional system that can be scan tested.
Figure 1D:
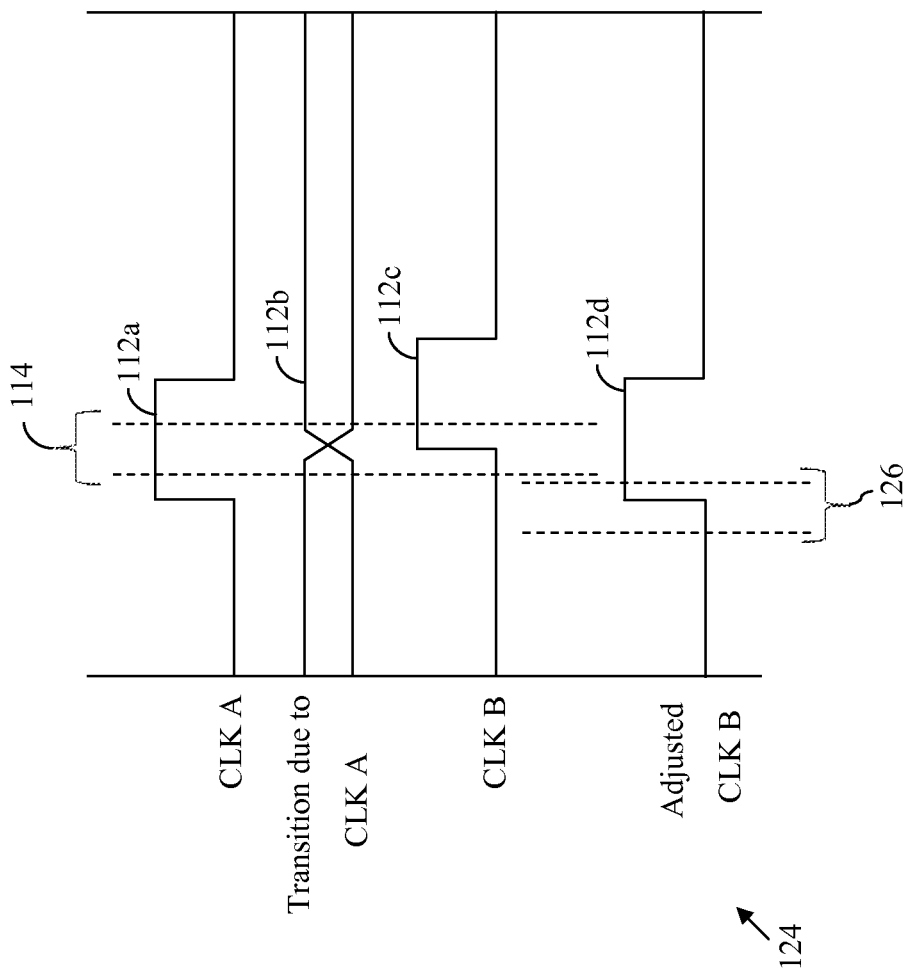
FIG. 1D is a timing diagram illustrating the operation of the system of FIG. 1C.
Figure 2:
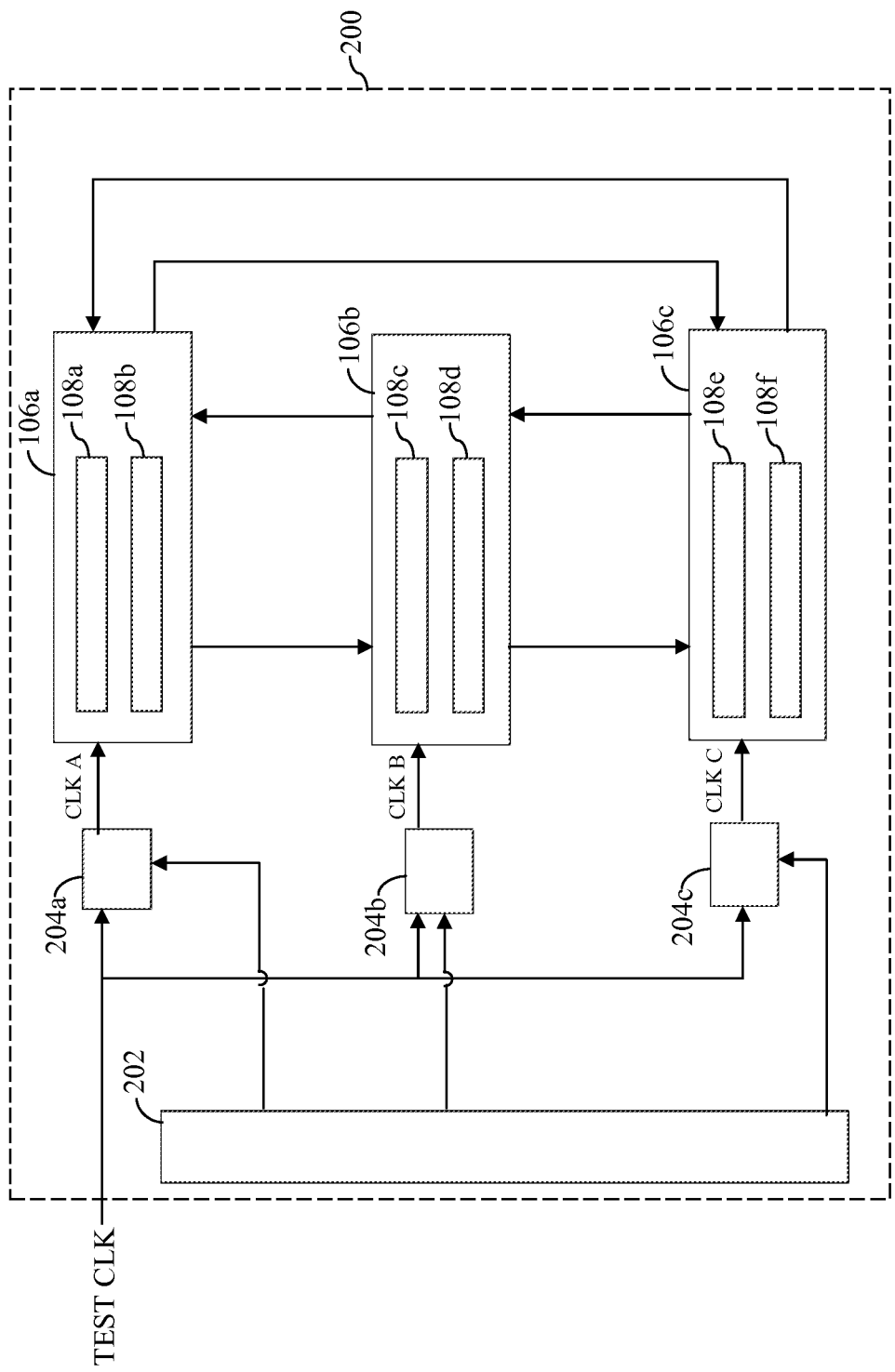
FIG. 2 is a schematic block diagram illustrating a system for scan testing in accordance with an embodiment of the present invention.

Referring now to FIG. 2, a schematic block diagram of an integrated circuit (IC) 200 that allows for scan testing in accordance with an embodiment of the present invention is shown. The IC 200 includes a clock gate control unit 202, and clock gating cells 204a, 204b, and 204c. The IC 200 also includes the clock domains 106a-106c and scan chains 108a-108f as the IC 104 of FIGS. 1A and 1C. As will be understood by those of skill in the art, the number of clock domains and scan chains shown here is exemplary only.

Test stimuli are provided to the IC 200. The scan testing of the IC 200 proceeds through the three stages: shift-in, capture, and shift-out. As is well known to those of skill in the art, during the shift-in stage, the test data is loaded into the scan cells (not shown). Thereafter, the test patterns are provided to the combinational logic at the last clock cycle of the shift-in phase. Subsequently, the responses to the test patterns obtained from the combinational logic are captured by the scan cells during the capture phase. The responses are shifted out of the scan cells during the shift-out phase. Thereafter, the output test responses are compared with the expected test responses on an external tester (not shown) to determine faults in the IC 104.

The various testing stages are performed using the clock signals CLK A, CLK B, and CLK C provided by the clock gating cells 204a, 204b, and 204c. The clock gating cells 204a, 204b, and 204c receive the TEST CLK signal as well as clock control signals from the clock gate control unit 202. The signals from the clock gate control unit 202 control the clock signals CLK A, CLK B, CLK C output by the clock gating cells 204a, 204b, and 204c. The generation of the clock control signals and the subsequent control of the clock gating cells 204a-204c will be explained in detail with reference to FIGS. 3 and 4.

During the shift-in/shift-out phases, the TEST CLK signal passes un-gated through the clock gating cells 204a, 204b, and 204c to reach the clock domains 106a, 106b, and 106c. This enables simultaneous loading of the scan chains 108a-108f with test patterns during the shift-in phase. Further, this also ensures that the responses to the test patterns are shifted out of the scan chains 108a-108f simultaneously during the shift-out phase. That is, the clock gate control unit 202 does not affect clock gating cells 204a-204c during the shift phase.

During the capture phase, the clock signals CLK A, CLK B, and CLK C are switched in a manner such that the clock signals are staggered with respect to each other. The mutual displacement of the active clock edges of the clock signals CLK A, CLK B, and CLK C enables the various storage elements of the first clock domain 106a to settle before the second clock domain 106b receives an active clock edge.

Figure 3:
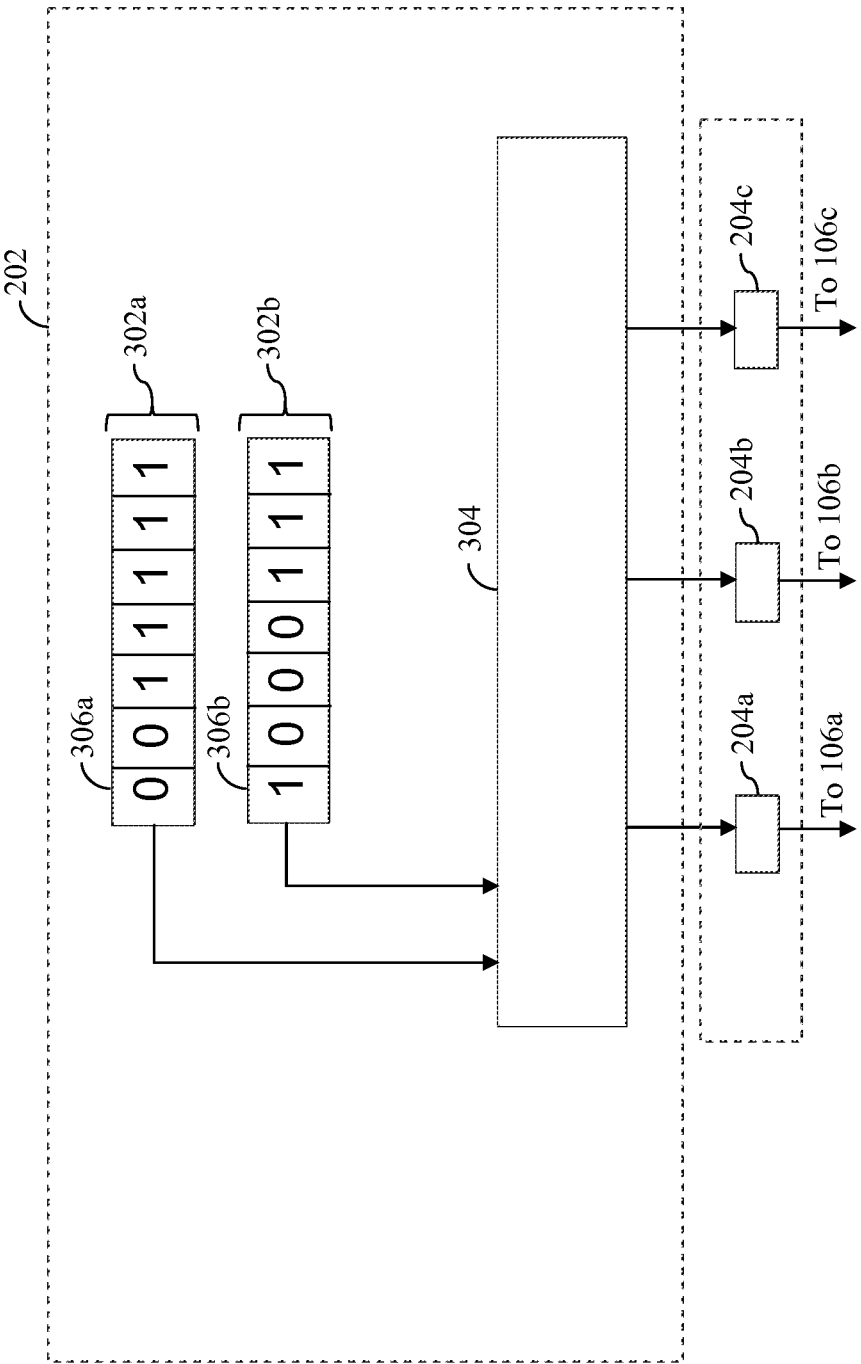
FIG. 3 is a schematic block diagram illustrating a clock gate control unit in accordance with an embodiment of the present invention.

Referring now to FIG. 3, a schematic block diagram illustrating the clock gate control unit 202 is shown in accordance with an embodiment of the present invention. The clock gate control unit 202 includes registers 302a and 302b, and a decoder 304. The registers 302a and 302b include register cells 306a and 306b respectively. Additionally, FIG. 3 also depicts the clock gating cells 204a, 204b, and 204c. According to the present invention, $2^n$ registers are used to control 'n' clock domains.

The registers 302a and 302b are scannable and hence initialized during the shift phase of the scan pattern. In an embodiment of the present invention, the registers 302a and 302b are shift registers and are clocked by the un-gated TEST CLK signal. Subsequent to entering the capture phase, at each active edge of the TEST CLK, the values in the registers 302a and 302b are shifted left, i.e., towards the register cells 306a and 306b. Further, at each active edge, the data bits present in the register cells 306a and 306b are provided to the decoder 304. In an embodiment of the present invention, the decoder 304 includes a combination of 'N×M' de-multiplexer and some combinational logic. The value of 'N' corresponds to the number of registers used in the clock gate control unit 202. The value of 'M' corresponds to the number of clock domains that need to be controlled. Since, the number of clock domains controlled in the present example is three, therefore M=3 and N=2. Similarly, if the number of clock domains to be controlled is eight, M=8 and N=3, where the value of N is obtained based on the following expression, $N \geq \log_2 M$. The decoder 304 provides the clock gate control signals for controlling the clock gating cells 204a, 204b, and 204c based on the input values received from the registers 302a and 302b. The operation of the clock gate control unit 202 will be explained in detail in conjunction with FIG. 4.

Figure 4:
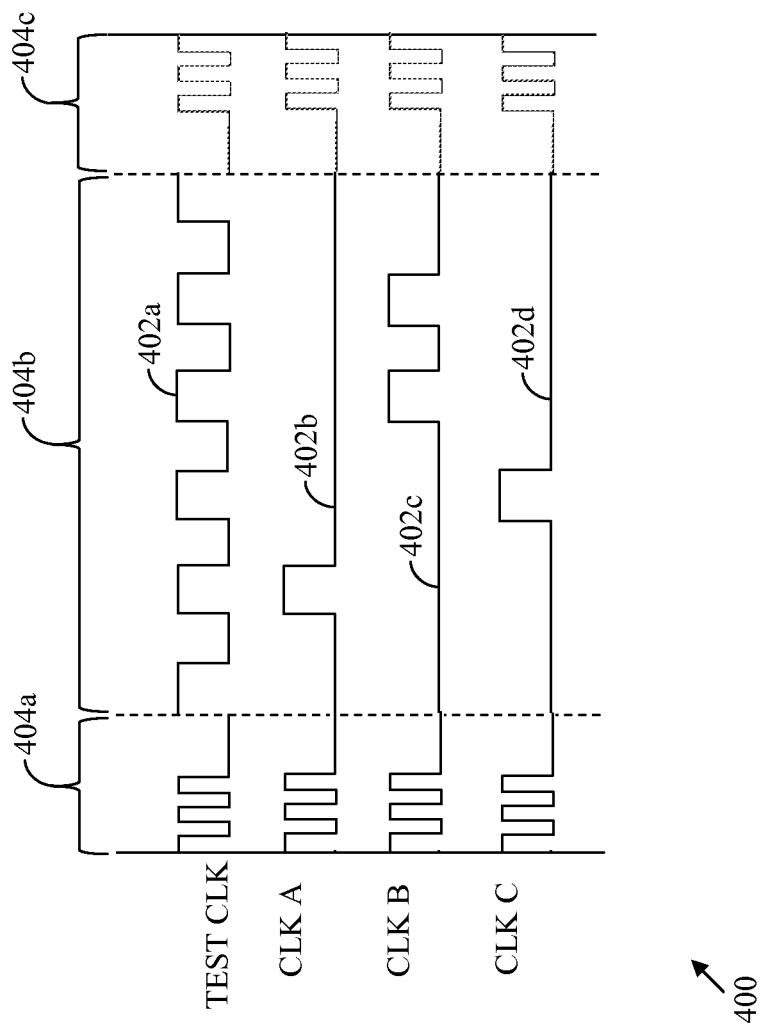
FIG. 4 is a timing diagram illustrating the operation of the system of FIG. 2 in accordance with an embodiment of the present invention.

Referring now to FIG. 4, a timing diagram 400 depicting the time-staggered clock signals CLK A, CLK B, and CLK C of FIGS. 2 and 3 is shown in accordance with an embodiment of the present invention. The logic timing diagram 400 includes waveforms 402a, 402b, 402c, and 402d. The waveform 402a includes waveform portions 404a, 404b, and 404c.

The waveforms 402a, 402b, 402c, and 402d correspond to the clock signals TEST CLK, CLK A, CLK B, and CLK C respectively. The waveform 402a is a free running test clock signal provided externally through a top-level package pin of the integrated circuit 200. The waveform portion 404a is the shift-in phase of the scan testing procedure. The waveform portion 404b is the capture phase of the scan testing procedure, and the waveform portion 404c is the shift-out phase. During the shift-in and shift-out phases of scan testing, the clock gating cells 204a, 204b, and 204c are enabled so that the TEST CLK signal propagates to the various clock domains. The waveforms 402b, 402c, and 402d are generated by selectively blocking the propagation of the waveform 402a through the clock gating cells 204a, 204b, and 204c during the capture phase 404b. The waveform 402a is allowed to pass through the clock gating cells 204a-204c and propagate to the clock domains 106a-106c only for selective durations. The selective durations are governed by the data bits contained within the register cells 306a and 306b. For example, exemplary data bits corresponding to an active edge in CLK A are '00'. As illustrated in FIGS. 3 and 4, when the decoder 304 receives data bits '00' from the register cells 306a and 306b, the decoder 304 then transmits clock gate control signals to the clock gating cells 204a, 204b, and 204c. As a result, the signal TEST CLK passes through the clock gating cell 204a and an active edge in the waveform 402b is observed. Similarly, the decoder 304 transmits clock gate control signals corresponding to binary sequences '01' and '10'. Therefore, it may be noticed that active edges may be provided in either of the waveforms 402a, 402b, and 402c in any desired order. Further, a predetermined number of consecutive active edges may be provided in a predetermined waveform by shifting-in corresponding codewords in a manner such that the data bits transmitted by the register cells 306a and 306b are repeated. For example, two consecutive active edges appear in the waveform 402c. This is a result of data bits '01' transmitted twice to the decoder 304.

Further, the decoder 304 may be used to generate signals that disable CLK A, CLK B, and CLK C. In an embodiment of the present invention, the decoder 304 is a combination of an N×M multiplexer and an AND gate. Based on the data bits received from the registers 302a and 302b, the output of the AND gate may be used to disable CLK A, CLK B, and CLK C such that no active edge is provided in either of the waveforms. For example, when the register cells 306a and 306b provide data bits '11' to the AND gate, the output is binary one. The N×M multiplexer may be configured to disable the clock gating cells 204a, 204b, and 204c upon receipt of binary one, thereby disabling CLK A, CLK B, and CLK C. It should be realized by persons skilled in the art that instead of being disabled by an input of binary one, the decoder 304 may be configured to be disabled by binary value zero or any predetermined binary sequence. Correspondingly, the AND gate may be replaced by a NAND gate that generates an appropriate binary value corresponding to which the decoder 304 is disabled.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. In an integrated circuit having a plurality of clock domains, a system for generating a plurality of time staggered internal clock signals for scan testing the integrated circuit, the system comprising:
    one or more registers clocked by a single test clock signal, wherein the one or more registers are loaded with one or more codewords, and wherein the number of the registers equals two to the power of the number of the clock domains;
    a decoder, connected to the one or more registers, for providing one or more clock gate control signals, wherein the one or more clock gate control signals are based on one or more data bits of the one or more code words; and
    a plurality of clock gating cells connected to the decoder, for providing the plurality of time-staggered internal clock signals, wherein each clock gating cell operates based on a respective one of the clock gate control signals, and wherein each clock gating cell receives the single test clock signal.

2. The system of claim 1, wherein the one or more registers are shift registers.

3. The system of claim 1, wherein the one or more codewords are combinations of binary values.

4. The system of claim 1, wherein the plurality of time-staggered internal clock signals drives the plurality of clock domains of the integrated circuit.

5. A scan testable integrated circuit, comprising:
    a plurality of registers clocked by a single test clock signal, wherein the plurality of registers is loaded with one or more codewords;

a decoder, connected to the plurality of registers, for providing a plurality of clock gate control signals, wherein the clock gate control signals are generated using data bits of the one or more codewords;

a plurality of clock domains driven by a plurality of time-staggered internal clock signals, wherein the number of the registers equals two to the power of the number of the clock domains; and a plurality of clock gating cells connected to the decoder and to respective ones of the plurality of clock domains, for providing a plurality of time-staggered internal clock signals to the plurality of clock domains, wherein each clock gating cell operates based on the clock gate control signal, and wherein each clock gating cell receives the single test clock signal.

6. The integrated circuit of claim 5, wherein a plurality of test patterns is provided for testing the integrated circuit.

7. The integrated circuit of claim 5, wherein the one or more registers are shift registers.

8. The integrated circuit of claim 5, wherein the one or more codewords are combinations of binary values.

* * * * *